United States Patent
Hynecek

(10) Patent No.: US 6,229,133 B1
(45) Date of Patent: May 8, 2001

(54) IMAGE SENSING DEVICE WITH DELAYED PHASE FREQUENCY MODULATION

(75) Inventor: Jaroslav Hynecek, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/174,183

(22) Filed: Oct. 16, 1998

Related U.S. Application Data

(60) Provisional application No. 60/063,323, filed on Oct. 27, 1997.

(51) Int. Cl.[7] .............................. H04N 3/14; H01L 27/00
(52) U.S. Cl. ........................................ 250/208.1; 348/302
(58) Field of Search .......................... 250/208.1, 214 R, 250/214.1, 214 DC; 348/302, 294, 295, 297, 303, 304, 305, 320; 327/514, 515

(56) References Cited

U.S. PATENT DOCUMENTS 4,819,070 * 4/1989 Hynecek .............................. 348/302

* cited by examiner

Primary Examiner—John R. Lee
Assistant Examiner—Kevin Pyo
(74) Attorney, Agent, or Firm—Alan K. Stewart; Wade James Brady, III; Frederick J. Telecky, Jr.

(57) ABSTRACT

An image sensing device includes: a light sensing element 20 for providing a signal in response to incident light; a comparator 24 coupled to the photo sensing element 20 for detecting when the signal reaches a reference level $V_{REF}$; a resetting device 22 coupled to the light sensing element 20 for resetting the light sensing element 20 when the signal reaches the reference level $V_{REF}$; and a memory device 26 coupled to the comparator 24 for receiving and storing an output from the comparator 24.

10 Claims, 4 Drawing Sheets

US 6,229,133 B1

IMAGE SENSING DEVICE WITH DELAYED PHASE FREQUENCY MODULATION

This application claims priority under 35 USC §119(e)(1) of provisional application number 60/063,323, filed Oct. 27, 1997.

FIELD OF THE INVENTION

This invention generally relates to image sensing devices, and more particularly it relates to image sensing devices with a frequency modulated output exhibiting a randomly delayed phase.

BACKGROUND OF THE INVENTION

In a typical prior art image sensor, light generated carriers are integrated for a predetermined fixed integration time. After the integration is completed, charge is converted to voltage and read out. Voltage can be read out in each pixel directly by an x-y scanner or by a single charge detector, common to the whole array, if a CCD charge transferring principle is employed. The output signal from such devices is always an analog voltage proportional to the product of light intensity and integration time.

There are several disadvantages to the standard prior art approach. The analog signal level is small in the areas of low illumination and high in the areas of high illumination. The charge detector thus must have a high dynamic range and a high linearity over this range. A very low noise floor is also required to detect low level signals. Another disadvantage is the possibility for a flicker caused by the beat between the illuminating source frequency (fluorescent lighting) and the frame scanning frequency determined by the integration period. Many problems also arise when the analog signal needs to be converted to its digital equivalent. Complicated signal conditioning circuits such as CDS and AGC amplifiers need to be used to interface between the sensor and the A/D converter. This is power consuming, costly, and potentially distorts the signal if not properly implemented.

SUMMARY OF THE INVENTION

Generally, and in one form of the invention, an image sensing device includes: a light sensing element for providing a signal in response to incident light; a comparator coupled to the photo sensing element for detecting when the signal reaches a reference level; a resetting device coupled to the light sensing element for resetting the light sensing element when the signal reaches the reference level; and a memory device coupled to the comparator for receiving and storing a digital output from the comparator.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment is an improved image sensing concept with a digital output that eliminates many drawbacks of the prior art. Charge is converted into a digital signal directly at the photosite or as close to it as possible. The conversion is accomplished at a predetermined fixed level well above the noise floor which eliminates the conversion nonlinearities and improves the dynamic range. The integration time for each photosite differs according to illumination level, so that there is no global integration period possibly causing an image flicker.

Figure 1:
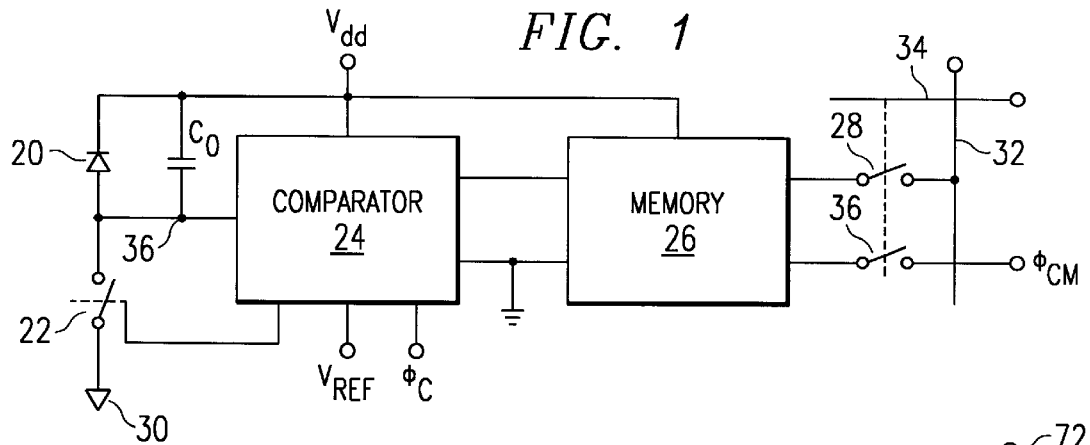
FIG. 1 is a preferred embodiment general pixel concept.

A preferred embodiment general pixel concept is shown in FIG. 1. The device of FIG. 1 includes photosensing element (light sensing element) 20, reset switch 22, capacitor $C_o$, comparator 24, n-bit memory cell 26, multiplex (MUX) switch 28, and 36, source voltage $V_{dd}$, reference voltage $V_{ref}$, clock signal $\phi_c$, memory control signal $\phi_{CM}$, common node (ground) 30, word line (output) 32, and bit line (Y-address) 34. The capacitor Co represents the charge integration and storage component of the photosensing element 20. The preferred embodiment in FIG. 1 is a photosensing element which can be reset by feedback from a comparator and provide a digital output to a memory element that is coupled to a multiplexer for readout and reset at a later unspecified time (hence a delayed phase frequency modulation). The light sensing element can be any type of a photo diode including buried or pinned architectures. The light sensing element can also be a CCD (charge coupled device) structure with at least one stage or only a portion of a stage such as a CCD photogate.

The operation of the device of FIG. 1 is similar to a single-slope analog to digital (A/D) converter, one of the simplest methods of analog to digital conversions. It also resembles a Delta Sigma A/D concept where the Delta element is replaced by a reset. The operation is as follows. Input current is integrated on a capacitor. When the voltage on the capacitor reaches a threshold, the capacitor is reset and the time to reset is measured. In some cases it is easier to count the number of resets in a given larger interval of time rather than to measure the time interval length of a single cycle itself. This method is preferred in the present description.

The typical image sensor pixel is almost an ideal integrator. The current source is represented by the photon generated current.

Therefore, this A/D converter concept is suitable to be used for in-pixel A/D conversion. The device of FIG. 1 provides a technique for extracting the digital signal from many pixels in a typical image sensor array.

The operation of the device of FIG. 1 proceeds as follows. As light is sensed, the photo sensing element 20 produces current which discharges capacitor $C_o$. When the voltage on the sense node 36 reaches the reference voltage $V_{ref}$, the capacitor $C_o$ is reset by reset switch 22 and a digital "one" is stored in memory 26. The reference voltage $V_{ref}$ can be globally and dynamically controlled in each pixel or fixed. After reset, the cycle is repeated.

The memory element 26 utilized in each pixel allows time for pixel addressing and readout. Since many pixels are present in the array, the readout time is not negligible. Moreover, the instant of the readout can not be in sync with each photosite reset. The phase delay of the digital output is thus random in general and does not carry any useful information. The length of the readout time of course depends on the array architecture.

Figure 2:
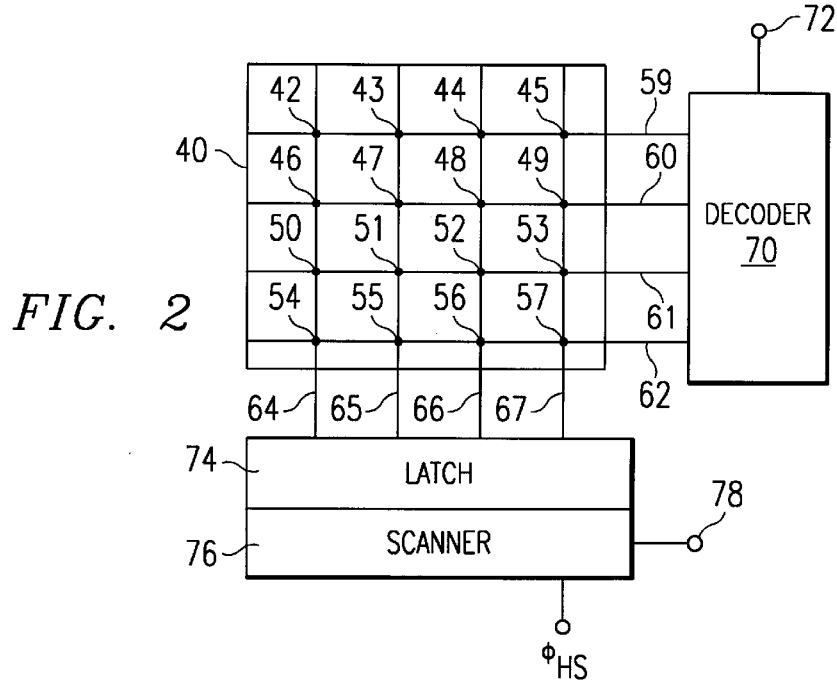
FIG. 2 is an array architecture incorporating the pixel concept of FIG. 1.

An example array architecture is shown in FIG. 2. The architecture of FIG. 2 includes image sensor array 40 which includes image pixels 42–57, Y-address 59–62, and word lines 64–67; Y-decoder 70; Y-address input node 72; horizontal data latch 74; horizontal scanner 76; horizontal scan clock signal $\phi_{HS}$; and data output node 78. The image pixels 42–57 contain the device shown in FIG. 1. The Y-address input, which is either in serial or parallel fashion, is used to select one of the horizontal lines 59–62 in the image sensor array 40. When one of the horizontal lines 59–62 is selected, all the n-bit memory cells in that line are addressed and output to the horizontal data latch 74 through the word (column) lines 64–67. Then the data is transferred to output node 78 by the horizontal scanner (shift register) 76. While the data is scanned by the horizontal scanner 76, another one of the horizontal lines 59–62 can be addressed. The horizontal data latch 74 allows for Y-addressing and readout simultaneously.

The output from the sensor is a series of bits (zero or one) depending on the data which was stored in the n-bit pixel memory 26. When the memory data is addressed and clocked out, the memory is also reset. The data from the line latch 74 can be scanned out from the sensor either in a serial fashion or in a mixed parallel/serial organization. It is easily seen for example that the columns of the vertical word lines 64–67 can be grouped by eight and scanned in parallel. This is not a problem for digital systems. Any grouping can be accomplished.

An important element of the pixel shown in FIG. 1, in addition to the memory 26, is the comparator 24. A simple comparator circuit such as a dynamic comparator used in DRAMs can be used in the device of FIG. 1 because it is fast and consumes little power. The comparing function is "on" only when the clock signal $\phi_c$ is "on". Since the discrete intervals of the clock signal are finite, a small error in the frequency modulation results. This error, however, is balanced by a large power savings because the comparator is "off" most of the time. The accuracy can be increased by increasing the frequency of comparator clock signal $\phi_c$. Many schemes are possible. Global frequency control and dynamic frequency control for each pixel, or block frequency control can be used.

Another important element of the pixel is the MUX switch 28, shown in FIG. 1. This is a standard circuit which transfers data to the column word lines 64–67. It can also accomplish the memory reset if the memory is simple and stores only a single bit of data. For a multiple bit memory 26, the data is clocked out to word lines 64–67 by memory control signal $\phi_{cm}$. Memory control switch 36 is "on" when MUX switch 28 is "on".

Figure 3:
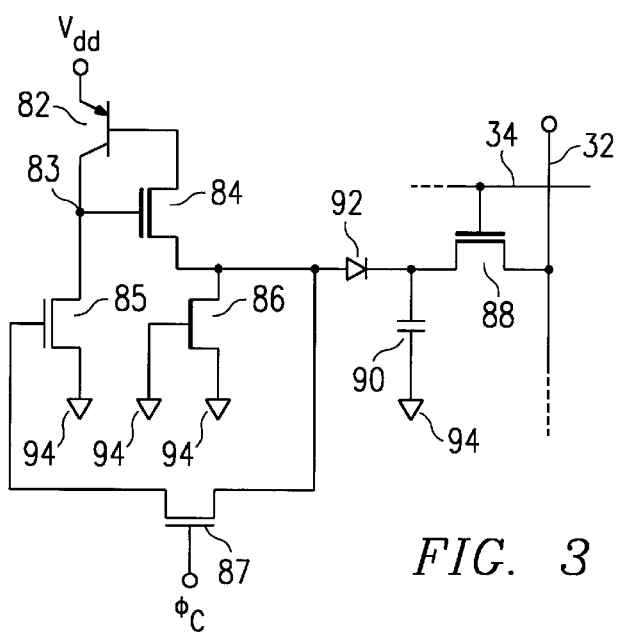
FIG. 3 is a pixel circuit which implements the general pixel concept in FIG. 1.
Figure 4:
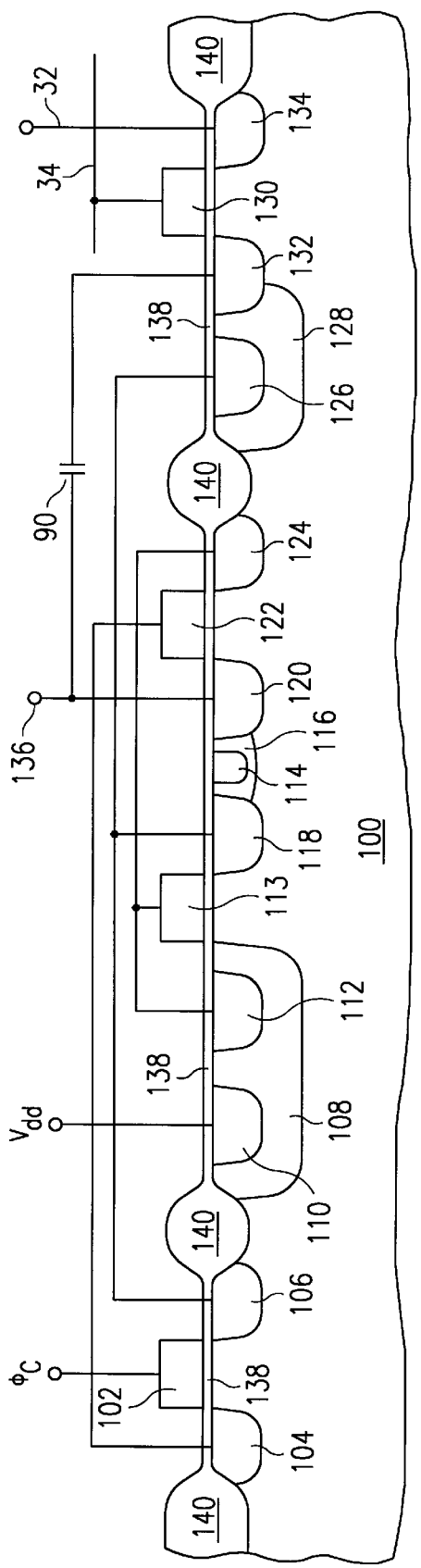
FIG. 4 a semiconductor device cross section of the circuit of FIG. 3.

An example pixel circuit which implements the general pixel concept in FIG. 1 is shown in FIG. 3. The pixel circuit of FIG. 3 includes photo transistor 82, transistors 84–88, capacitor 90, diode 92, bit line (Y-address) 34, column sense line (word line) 32, source voltage $V_{dd}$, clock signal $\phi_c$, and common node (ground) 94. An example semiconductor device cross section of the circuit of FIG. 3 is shown in FIG. 4. The device of FIG. 4 includes P type layer 100; transistor 87 which includes gate 102 and N+regions 104 and 106; phototransistor 82 which includes N region 108 and P+regions 110 and 112; transistor 84 which includes gate 113, N region 108, and N+region 118; transistor 86 which includes P+region 114, N region 116, and N+regions 118 and 120; transistor 85 which includes gate 122 and N+regions 120 and 124; diode 92 which includes P+region 126 and N region 128; MUX transistor 88 which includes gate 130 and N+regions 132 and 134; capacitor 90; clock signal $\phi_c$, source voltage $V_{dd}$, ground node (common node) 136, gate oxide 138, field oxide 140, word line 32, and bit line 34. The transistor, diode, and capacitor reference numbers are from FIG. 3. The circuit of FIG. 3 is only an example, the general pixel concept of FIG. 1 can be implemented by many other circuit configurations. The capacitor 90 represents only a single bit memory in this case.

The operation of the circuit of FIG. 3 is described below. After transistor 85 resets phototransistor 82 and the gate of transistor 84, the photo generated carriers cause holes to be injected from the emitter of photo transistor 82. This hole current charges the gate of transistor 84. As soon as the potential of the gate of transistor 84 crosses the threshold (internal transistor reference voltage in this case), transistor 84 turns on. This increases the base current of photo transistor 82 and, through a regenerative process, both transistor 84 and photo transistor 82 are turned hard on. When transistor 84 and photo transistor 82 are turned on, diode 92 charges capacitor 90 to a "high" state. When clock signal $\phi_c$ is turned on (high) at the same time that transistor 84 is on, transistor 85 is turned on and the gate of transistor 84 is reset. Since the capacitance of node 83 is small compared to the load capacitance of transistor 84, node 83 is discharged faster than both transistor 84 and phototransistor 82 are turned off. This resets the photosite. When clock signal $\phi_c$ is turned on and transistor 84 is off, transistor 85 remains off and the integration continues. When capacitor 90 is addressed by MUX transistor 88, it is discharged.

Figure 5:
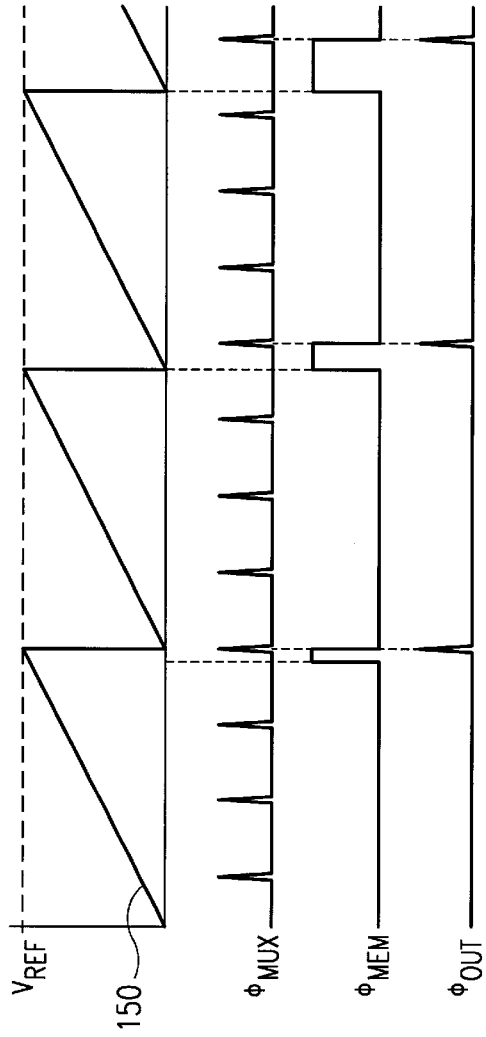
FIG. 5 is a timing diagram describing the operation of the device of FIG. 3.

The operation of the device of FIG. 3 is described in further detail by the timing diagrams shown in FIG. 5. The photosite signal 150 represents the voltage at node 83 in FIG. 3. As charge integrates in phototransistor 82, the voltage at node 83 rises as shown in FIG. 5. When the voltage at node 83 reaches the threshold voltage $V_{REF}$, transistor 84 turns on. This charges capacitor 90 (memory element), as shown by the memory pulses $\phi$mem. On the next pulse of the clock signal $\phi_c$ after transistor 84 turns on, the voltage at node 83 is reset by transistor 85. Clock signal $\phi_c$ is not shown in FIG. 5. $\phi_c$ is substantially faster than bit line signal $\phi$MUX.

The voltage on capacitor 90 is then readout on the next pulse of the bit line signal $\phi$MUX. Capacitor 90 is discharged during readout. The output signal $\phi$out is then a series of pulses, as shown in FIG. 5 with their phase in general randomly delayed with respect to reset. The frequency of the pulses in output signal $\phi$out is proportional to the intensity of the light impinging on the phototransistor 82 with the phase not carrying any useful information. The frequency period to intensity is mapped linearly in discrete increments determined by the frequency of photosite clock signal $\phi_c$. The output signal $\phi$out can be processed by simple filtering or more sophisticated digital decimation such as that used in delta-sigma analog-to-digital converters.

Figure 6:
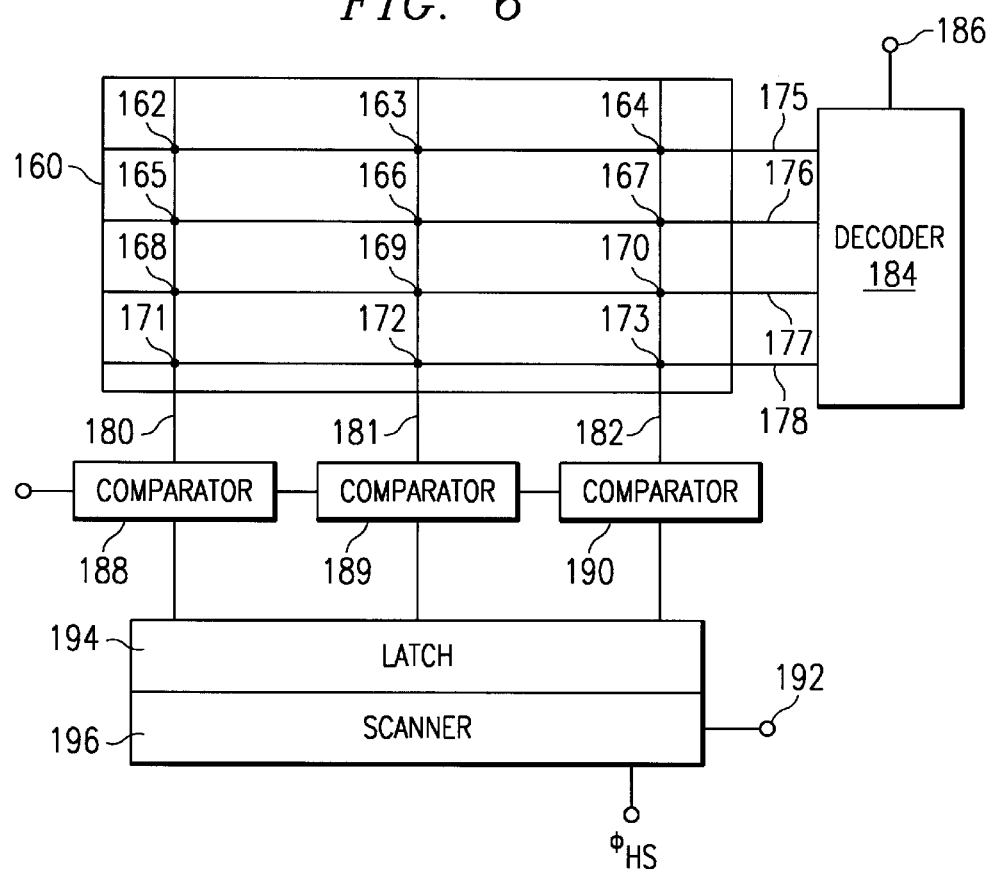
FIG. 6 is a modification of the architecture of FIG. 2 with only one comparator and one memory element for each column in the array.

For small arrays, the general pixel concept of FIG. 1 and architecture of FIG. 2 can be modified such that a single comparator and memory element can be used for all the pixels in a column of the array, as shown in FIG. 6. The architecture of FIG. 6 includes image sensor array 160 which includes image pixels 162–173, Y-address lines 175–178, and word lines 180–182; Y-decoder 184;

Y-address input node 186; comparators 188–190; horizontal data latch 194; horizontal scanner (shift register) 196; horizontal scan clock signal $\phi_{HS}$; and data output node 192. The word lines 180–182 also serve as the reset lines.

For the device of FIG. 6, the addressing time is short. This allows for a single memory element in latch 194 and a single comparator 188–190 for each column. The function of the sensor of FIG. 6 is essentially the same as the sensor of FIG. 2. The signal is output on the word lines 180–182 and compared with a threshold (reference voltage) by the comparators 188–190. When the threshold is crossed, a logic "one" is loaded into latch 194. The next line is addressed while the latch 194 is scanned out by scanner 196. When the threshold is crossed the corresponding photosite is reset as in the system in FIG. 2.

Figure 7:
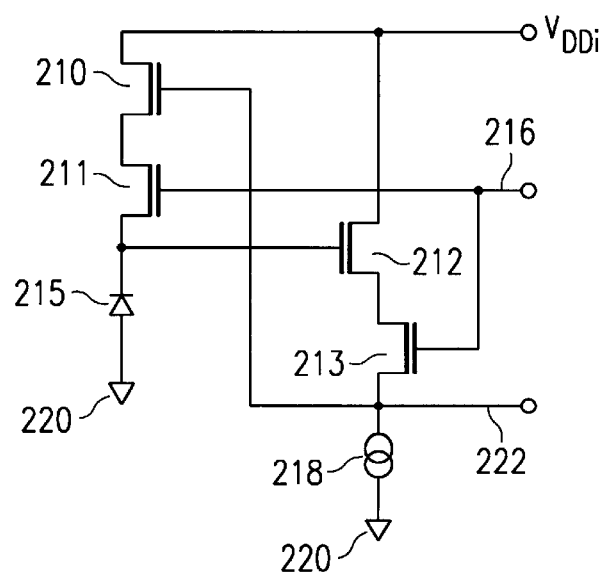
FIG. 7 is a pixel circuit for the architecture of FIG. 6.

An example pixel circuit for the image pixels 162–173 of FIG. 6 is shown in FIG. 7. The pixel circuit of FIG. 7 includes NMOS transistors 210–213; photodiode 215 (light sensing device); image sensor bias voltage $V_{DDi}$; Y-address line 216; current load 218; common node 220; and word line (output and reset) 222. Reset is accomplished when there is a "high" signal on both Y-address line 216 and word line 222. This resets the photodiode 18 to the $V_{DDi}$ bias.

Figure 8:
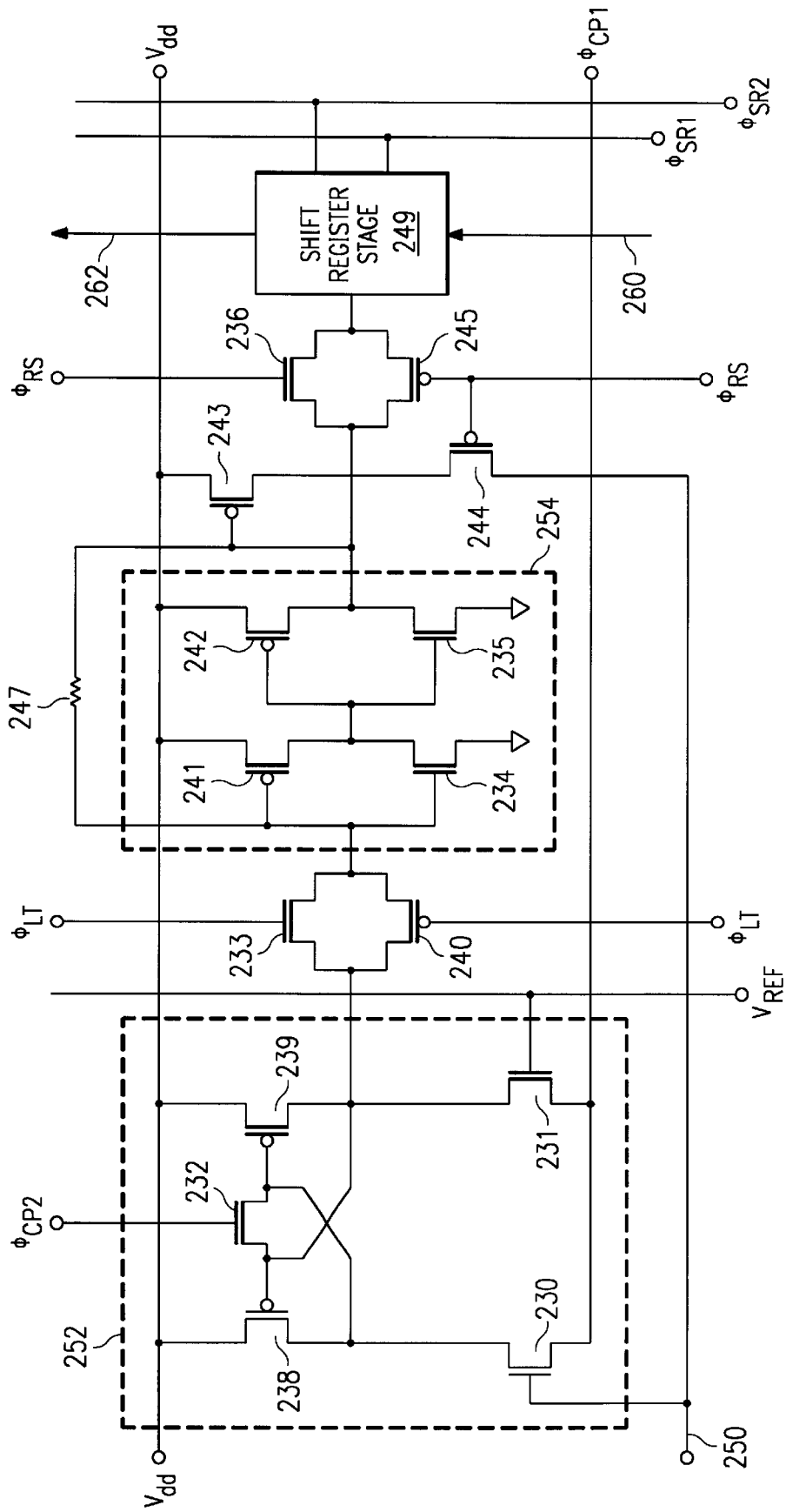
FIG. 8 is a comparator, latch, and scanner stage for a column of the array of FIG. 6.

An example of the comparator, latch, and scanner (shift register) for a column of the small array of FIG. 6 is shown in FIG. 8. The circuit of FIG. 8 includes NMOS transistors 230–236, PMOS transistors 238–245, resistor 247, shift register stage (scanner stage) 249, source voltage $V_{dd}$, reference voltage $V_{REF}$, column sense line 250, latch stage transfer pulse $\phi_{LT}$, comparator control signals $\phi_{CP1}$ and $\phi_{CP2}$, shift register load pulse $\phi_{RS}$, and shift register clocks $\phi_{SR}$ and $\phi_{SR}$. Transistors 230, 231, 232, 238, and 239 form comparator 252. Transistors 234, 235, 241, and 242 form memory 254. Line 260 is coupled to the previous shift register stage (not shown). Line 262 is coupled to the next shift register stage (not shown). This circuit requires a photocell such as the one shown in FIG. 7 which has a single common line for sensing and reset.

The operation of the circuit of FIG. 8 is described below. As the signal $\phi_{CP1}$ is turned on (low), the comparator 252 compares voltages on the sense line 250 and the $V_{REF}$ line. When the sense line output falls below reference voltage $V_{REF}$ (when the photosite has integrated sufficient charge), the comparator 252 will latch to a "low", output state. This state is loaded into memory 254 by transfer pulse $\phi_{LT}$. After this cycle, comparator control signals $\phi_{CP1}$ and $\phi_{CP2}$ are switched high to return the comparator 252 to its original state. The memory stage 254 then stores the "low" state of the comparator output. Then the shift register load pulse $\phi_{RS}$ is briefly turned on. This causes the "low" state of memory 254 to be loaded into the shift register stage 249. At the same time, both P-channel transistors 243 and 244 are on. This turns the reset line (sense line) 250 high. In the case when memory 254 is storing a "high" state, transistor 243 is off and the column reset line 250 will not be reset (not be turned high).

In the next step, the serial shift register 196 is scanned out to clock all the column data out of the sensor. At the same time, the photocell array address (Y address) is changed to select another line for readout.

The advantage of the architecture of FIG. 6 is less complexity in the pixel. The pixel can be designed smaller. Also power consumption is smaller since there are fewer comparators.

The architectures of FIGS. 2 and 6 can easily be modified to include more than one horizontal shift register in the array. Several registers can be operated in parallel to arrange the grouping of the data into a serial/parallel configuration in order to increase the readout speed. The number of parallel lines can be selected such that speed and power consumption are optimized.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, other memory (latch) configurations and comparator circuits can be used. It is therefore intended that the appended claims encompass any such modifications or embodiments.

What is claimed is:

1. An image sensor comprising:

a light sensing element for providing a signal in response to incident light;

a comparator coupled to the light sensing element for detecting when the signal reaches a reference level;

a resetting device coupled to the light sensing element for resetting the light sensing element when the signal reaches the reference level; and a memory device coupled to the comparator for receiving and storing an output from the comparator.

2. The device of claim 1 further comprising a multiplex switch coupled to an output of the memory device.

3. The device of claim 1 wherein the light sensing element is a photo transistor.

4. The device of claim 1 wherein the light sensing element is a photo diode.

5. The device of claim 1 wherein the memory device is a single bit memory.

6. The device of claim 1 wherein the memory device is a capacitor.

7. An image sensing device comprising:

an array of image sensing pixels having rows and columns;

Y-address lines, each of the Y-address lines is coupled to the image sensing pixels in a corresponding one of the rows;

comparators, each of the comparators coupled to an output of a corresponding one of the columns; and a latch coupled to the comparators.

8. The device of claim 7 further comprising a shift register coupled to the latch.

9. The device of claim 7 further comprising a decoder coupled to the Y-address lines.

10. A method for sensing light comprising:

accumulating charge on a light sensing element in response to incident light;

forming a signal from the accumulated charge;

comparing the signal to a reference level;

recording a first level in memory when the signal has not reached the reference level;

recording a second level in memory when the signal has reached the reference level;

resetting the light sensing element when the signal has reached the reference level; and repeating the above steps "In" times in a set period of time.

* * * * *